United States Patent
El-Khamy et al.

(10) Patent No.: US 10,673,467 B2
(45) Date of Patent: *Jun. 2, 2020

(54) APPARATUS AND METHOD FOR PARALLELIZED SUCCESSIVE CANCELLATION DECODING AND SUCCESSIVE CANCELLATION LIST DECODING OF POLAR CODES

(71) Applicant: Samsung Electronics Co., Ltd., Gyeonggi-do (KR)

(72) Inventors: Mostafa El-Khamy, San Diego, CA (US); Hsien-Ping Lin, Davis, CA (US); Jungwon Lee, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,928

(22) Filed: Dec. 11, 2018

(65) Prior Publication Data
US 2019/0109604 A1    Apr. 11, 2019

Related U.S. Application Data

(62) Division of application No. 15/398,378, filed on Jan. 4, 2017, now Pat. No. 10,153,787.

(Continued)

(51) Int. Cl.
*H03M 13/00* (2006.01)
*H03M 13/39* (2006.01)
(Continued)

(52) U.S. Cl.
CPC ...... *H03M 13/3961* (2013.01); *G06F 30/398* (2020.01); *H01L 22/10* (2013.01);
(Continued)

(58) Field of Classification Search
None
See application file for complete search history.

(56) References Cited

U.S. PATENT DOCUMENTS

| | | | |
|---|---|---|---|
| 2012/0147945 A1* | 6/2012 | Rayala | H04L 25/03216 375/233 |
| 2013/0117344 A1* | 5/2013 | Gross | G06F 17/10 708/490 |

(Continued)

FOREIGN PATENT DOCUMENTS

EP    3 073 642    9/2016

OTHER PUBLICATIONS

A. Balatsoukas-Stimming, et al. "LLR-Based Successive Cancellation List Decoding of Polar Codes," IEEE Transactions on Signal Processing, Sep. 2014, pp. 1-15.

(Continued)

*Primary Examiner* — Mujtaba M Chaudry
(74) *Attorney, Agent, or Firm* — The Farrell Law Firm, P.C.

(57) ABSTRACT

An apparatus and a method. The apparatus includes a receiver including an input for receiving a codeword of length $m^j$, where m and j are each an integer; a processor configured to determine a decoding node tree structure with $m^j$ leaf nodes for the received codeword and receive an integer i indicating a level at which parallelism of order m is applied to the decoding node tree structure; and m successive cancellation decoders (SCDs) configured to decode, in parallel, each child node in the decoding node tree structure at level i.

20 Claims, 3 Drawing Sheets

Related U.S. Application Data

(60) Provisional application No. 62/397,053, filed on Sep. 20, 2016.

(51) Int. Cl.
  *H04L 1/00* (2006.01)
  *G06F 30/398* (2020.01)
  *H01L 21/66* (2006.01)
  *H03M 13/13* (2006.01)

(52) U.S. Cl.
  CPC ....... *H03M 13/13* (2013.01); *H03M 13/6561* (2013.01); *H04L 1/0045* (2013.01); *H04L 1/0054* (2013.01); *H04L 1/0057* (2013.01)

(56) References Cited

U.S. PATENT DOCUMENTS

| | | | | |
|---|---|---|---|---|
| 2014/0365842 | A1* | 12/2014 | Li | H03M 13/09 |
| | | | | 714/752 |
| 2015/0016563 | A1* | 1/2015 | Mahdavifar | H04L 1/0075 |
| | | | | 375/295 |
| 2015/0026543 | A1* | 1/2015 | Li | H03M 13/13 |
| | | | | 714/776 |
| 2015/0092886 | A1* | 4/2015 | Ionita | H04L 25/4917 |
| | | | | 375/298 |
| 2015/0188666 | A1* | 7/2015 | Mahdavifar | H04L 1/0052 |
| | | | | 375/295 |
| 2015/0295593 | A1* | 10/2015 | Trifonov | H03M 13/3746 |
| | | | | 714/776 |
| 2015/0381208 | A1 | 12/2015 | Li et al. | |
| 2016/0013810 | A1* | 1/2016 | Gross | H03M 13/09 |
| | | | | 714/776 |
| 2017/0149531 | A1* | 5/2017 | Raza | G06F 11/10 |
| 2017/0230059 | A1* | 8/2017 | Giard | H03M 13/134 |
| 2017/0366199 | A1* | 12/2017 | Ge | H04L 1/0045 |
| 2017/0366204 | A1* | 12/2017 | Shi | H03M 13/09 |
| 2018/0076831 | A1* | 3/2018 | Hamelin | H03M 13/13 |

OTHER PUBLICATIONS

M. S. Mohammadi, et al., "FEC-Assisted Parallel Decoding of Polar Coded Frames: Design Considerations," Apr. 18, 2016.
E. Arikan, "Channel polarization: A method for constructing capacity-achieving codes for symmetric binary-input memoryless channels," IEEE, Jul. 20, 2009, pp. 1-23.
Sarkis, Gabi, and Warren J. Gross. "Increasing the throughput of polar decoders." IEEE Communications Letters, vol. 17, No. 4 Apr. 2013: 725-728.
Ido Tal, et al. "List Decoding of Polar Codes", Univeristy of Califorina, San Diego, La Jolla, CA 92093, May 31, 2012, pp. 1-11.
N. Stolte, Rekursive Codes mit der Plotkin-Konstuktion und ihre Decodierung, D17 Darmstadter Dissertation, Jan. 2002.
YouZhe Fan et al., "A Low-Latency List Successive-Cancellation Decoding Implementation for Polar Codes", IEEE Journal on Selected Areas in Communications, vol. 34, No. 2, Feb. 2016.
C. Zhang and K. K. Parhi, "Low-latency sequential and overlapped architectures for successive cancellation polar decoder", IEEE Transactions on Signal Processing, vol. 61, No. 10, May 15, 2013.
El-Khamy, M., H. P. Lin, and J. Lee. "Binary polar codes are optimised codes for bitwise multistage decoding." Electronics Letters 52.13 (Jun. 23, 2016): 1130-1132.
B. Yuan and K. K. Parhi, "Low-Latency Successive-Cancellation List Decoders for Polar Codes With Multibit Decision," IEEE Transactions on Very Large Scale Integration (VLSI) Systems, vol. 23, No. 10, Oct. 2015.
B. Yuan and K. K. Parhi, "Low-Latency Successive-Cancellation Polar Decoder Architectures Using 2-Bit Decoding," IEEE Transactions on Circuits and Systems I: Regular Papers, vol. 61, No. 4, Apr. 2014.
Carlo Condo et al., "Generalized Fast Decoding of Polar Codes", arXiv:1804.09508v1 [cs.IT], Apr. 25, 2018, 6 pages.

* cited by examiner

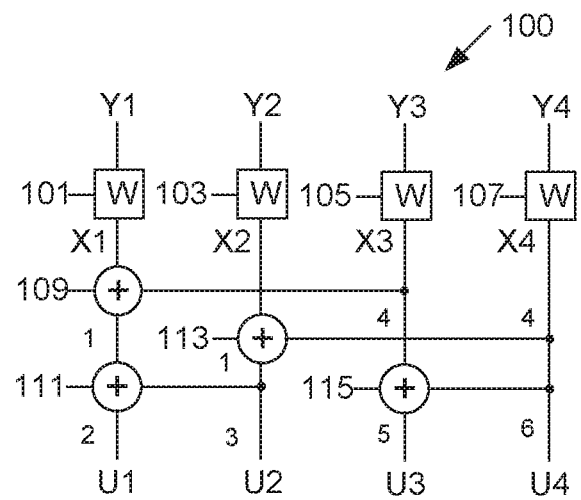
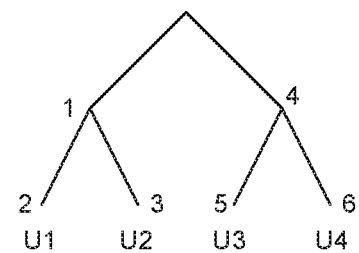
FIG. 1
FIG. 2
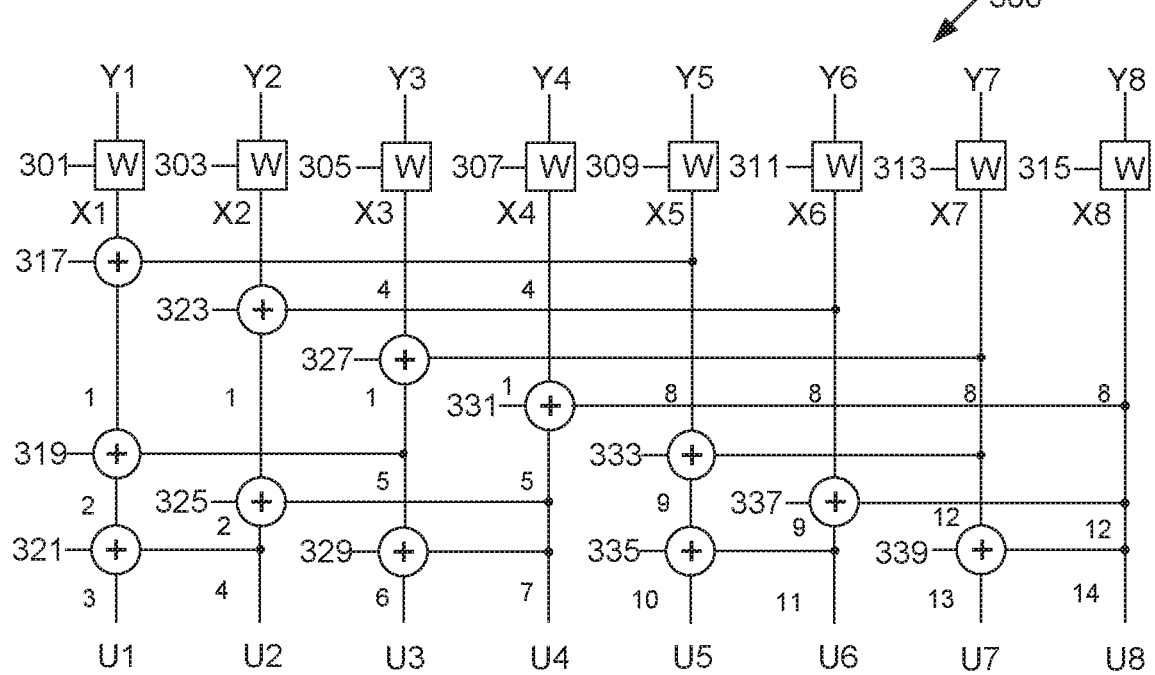
FIG. 3

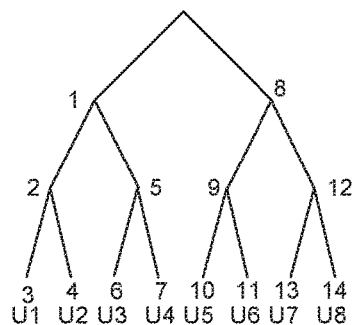
FIG. 4
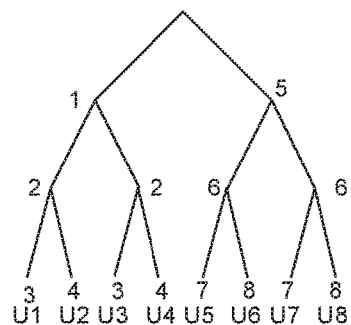
FIG. 5
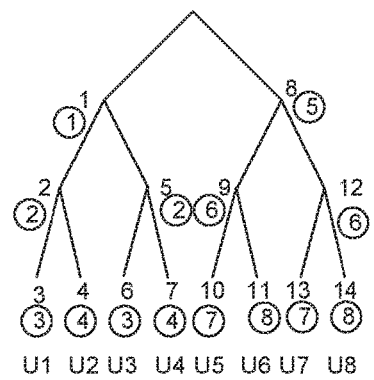
FIG. 6
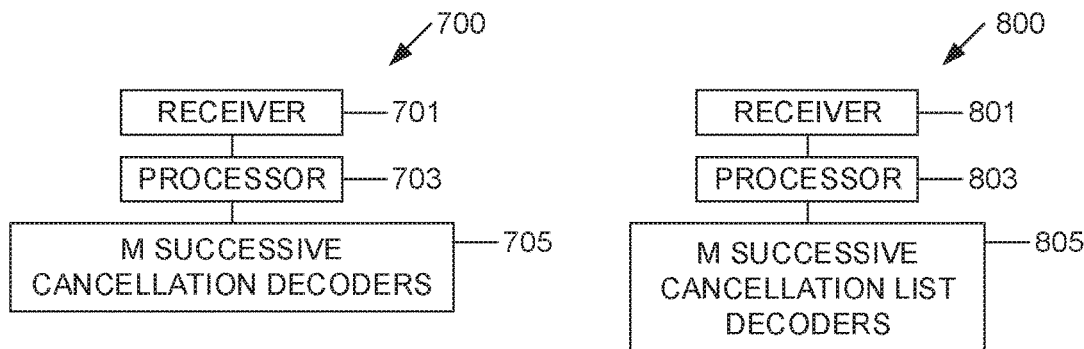
FIG. 7
FIG. 8
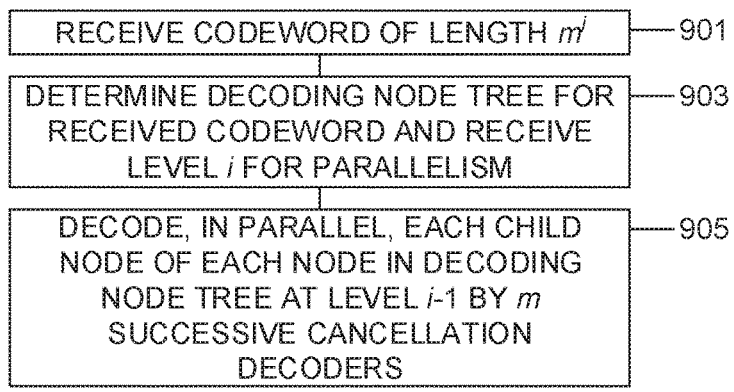
FIG. 9

APPARATUS AND METHOD FOR PARALLELIZED SUCCESSIVE CANCELLATION DECODING AND SUCCESSIVE CANCELLATION LIST DECODING OF POLAR CODES

PRIORITY

This divisional application claims priority under 35 U.S.C. § 120 to U.S. patent application Ser. No. 15/398,378, filed on Jan. 4, 2017 in the United States Patent and Trademark Office, which claimed priority under 35 U.S.C. § 119(e) to a U.S. Provisional Patent Application filed on Sep. 20, 2016 in the United States Patent and Trademark Office and assigned Ser. No. 62/397,053, the entire contents of each of which are incorporated herein by reference.

FIELD

The present disclosure relates generally to an apparatus and a method of successive cancellation decoding and successive cancellation list decoding of polar codes, and more particularly, to an apparatus and a method of parallelized successive cancellation decoding and successive cancellation list decoding of polar codes.

BACKGROUND

Polar codes are capacity achieving codes that have received a significant amount of attention recently, and are being considered as a specification for channel codes in fifth generation (5G) communication systems. Polar codes are also being considered for error correcting codes in memory systems.

Polar codes are classically decoded with a successive cancellation decoder (SCD) which has a computational complexity on the order of (N log N) for a code of length N, where N is an integer. However, the serial nature of an SCD also results in a large decoding latency of (N log N), where N is a code length. The SCD decoding latency can be reduced to 2N−2, using multidimensional polar decoding where multiplicities of each node at the decoding tree are decoded in parallel. Better decoding performance may be achieved by list decoding polar codes. However, list decoding of a polar code has a computational complexity on the order of O(LN log N) for a list size of L, which is an L-fold increase over that of successive cancellation decoding of a polar code.

SUMMARY

According to one embodiment, an apparatus includes a receiver including an input for receiving a codeword of length $m^j$, where m and j are each an integer; a processor configured to determine a decoding node tree structure with $m^j$ leaf nodes for the received codeword and receive an integer i indicating a level at which parallelism of order m is applied to the decoding node tree structure; and m successive cancellation decoders (SCDs) configured to decode, in parallel, each child node in the decoding node tree structure at level i.

According to one embodiment, a method includes receiving, by a receiver, a codeword of length $m^j$, where m and j are each an integer; determining, by a processor, a decoding node tree structure with $m^j$ leaf nodes for the received codeword, and receiving an integer i indicating a level at which parallelism of order m is applied to the decoding node tree structure; and decoding, by m successive cancellation decoders (SCDs) applied in parallel, each child node in the decoding node tree structure at level i.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 1 is a block diagram of an SCD system for a polar code of length 4;

FIG. 2 is an illustration of a decoding schedule for the SCD of FIG. 1;

FIG. 3 is a block diagram of an SCD system for a polar code of length 8;

FIG. 4 is an illustration of a decoding schedule for the SCD of FIG. 3;

FIG. 5 is an illustration of a decoding schedule for a parallelized SCD for a polar code of length 8, according to an embodiment of the present disclosure;

FIG. 6 is an illustration of a comparison of a decoding schedule for a non-parallelized SCD and a parallelized SCD for a polar code of length 8;

FIG. 7 is a block diagram of a parallelized SCD, according to an embodiment of the present disclosure;

FIG. 8 is a block diagram of a parallelized SCLD, according to an embodiment of the present disclosure;

FIG. 9 is a flowchart of a method of a parallelized SCD, according to an embodiment of the present disclosure;

DETAILED DESCRIPTION OF EMBODIMENTS OF THE PRESENT DISCLOSURE

Figure 10:
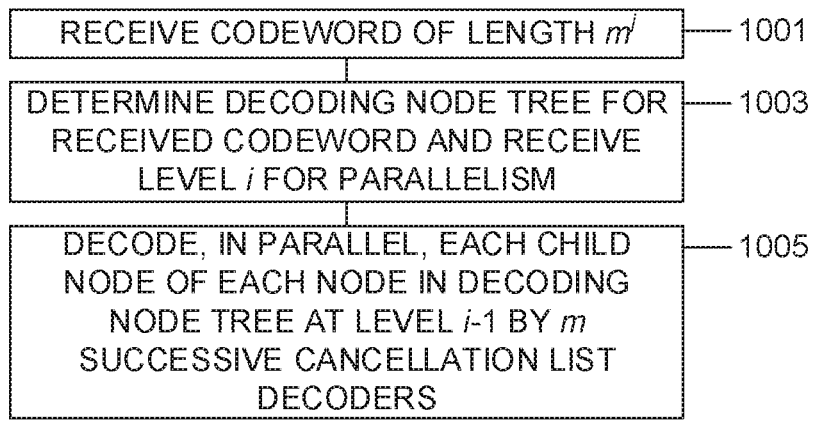
FIG. 10 is a flowchart of a method of a parallelized SCLD, according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term"and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or"have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns an apparatus and a method of parallel decoding to reduce a decoding latency of a polar code for both an SCD as well as an SCLD, where an SCD is a SCLD, where the list has a length of one. One embodiment of the present disclosure provides a flexible parallelization of decoding operations, including different degrees of parallelization of an SCD. The degree of parallelization may be adjusted based on at least one of performance, hardware complexity, and latency. Parallelized decoder operations may be integrated with those of a non-parallelized decoder via an error-checking mechanism to avoid degradation in performance.

The present disclose applies to polar code. However, the present disclosure is not limited thereto. The present disclosure may be applied to other codes (e.g., any code which uses similar SCD and SCLD architectures as the present disclosure, such as optimized recursive codes and variations of Reed-Muller codes).

One embodiment of the present disclosure parallelizes an SCLD, and one embodiment of the present disclosure combines lists of partial codewords into a list of complete codewords.

FIG. 1 is a block diagram of an SCD system 100 for decoding of a polar code of length N=4.

Referring to FIG. 1, $Y_1$ to $Y_4$ represent codeword bits received. Each W 101, 103, 105, and 107 represents a channel over which $Y_1$ to $Y_4$ are received, respectively, which may be noisy. $X_1$ to $X_4$ represent noiseless codeword bits intended by the possibly noisy $Y_1$ to $Y_4$, respectively. The adders 109, 111, 113, and 115 represent a polar encoder that transforms the input message bits $U_1$ to $U_4$ to a polar codeword represented by $X_1$ to $X_4$, respectively. A successive cancellation decoder (SCD) generates hard-decision estimates of the bits $U_1$ to $U_4$ by using estimates of the likelihood ratios or log likelihood ratios (LLRs) of the received symbols $Y_1$ to $Y_4$, which are used to successively estimate the likelihood ratios of the intermediate encoded bit values, until eventually estimating the likelihood ratios and hard decision estimates of the input bits. In the case of soft successive cancellation decoding, soft reliability estimates are passed between nodes instead of hard decisions. FIG. 1 shows an order of processing the LRs and making hard decisions by the corresponding decoder, where the order of processing is indicated by the numerals 1, 2, 3, 4, 5, and 6, where the processing order progresses from a lower valued numeral to a higher valued numeral. The decoder is assumed to use multidimensional decoding and have enough decoding modules where it can perform N/2 decoding operations in parallel, hence it can independently calculate the LLRs of intermediate bits at the input of adder 109 and adder 113 at the same time, which are then respectively used to independently calculate LLRs of X3 and X4 at the same time.

FIG. 2 is an illustration of a decoding schedule on the corresponding decoding tree for the SCD of FIG. 1.

Referring to FIG. 2, the decoding processing order is represented by a binary tree, where each node in the binary tree represents multiple operations. As described above, an SCD with N/2 decoding modules can deploy multidimensional decoding and calculate LLRs at the inputs of 109 and 113 simultaneously. However the decoding tree at the node labeled 1, can also represent sequential calculation of LLRs as by a conventional SCD at input of 109 and at the input of 113 if the number of deployed decoding modules is less than N/2. However, the present disclosure is not limited to binary polar codes. The present disclosure may use an m-ary polar code, where a decoding schedule may be represented by an m-ary tree, where m is an integer, where each node in the m-ary tree has m descendants, and where m decoders are executed in a decoding order.

In a conventional SCD, at each node (e.g., a parent node), the LR of one of the children nodes (e.g., the left child node) of the parent node is calculated using the LR of the parent node (e.g., $y_i$), and a hard decision is determined based on the calculated LR of the child node to estimate a value of the LR and propagate the estimated value to the parent node. The LR of the other child node (e.g., the right child) of the parent node is estimated using the LR of the parent node and the hard-decision estimate of the other node (e.g., the left child node), and a hard-decision is determined based on the LR of the other node (e.g., the right child node) to estimate a value of the LR of the other node and propagate the estimated value to the parent node.

FIG. 3 is a block diagram of an SCD system 300 for a polar code of length N=8.

Referring to FIG. 3, $Y_1$ to $Y_8$ represent codeword bits received. Each W 301, 303, 305, 307, 309, 311, 313, and 315 represents a channel over which $Y_1$ to $Y_8$ are received, respectively, which may be noisy. $X_1$ to $X_8$ represent noiseless codeword bits intended by the possibly noisy $Y_1$ to $Y_8$, respectively. The adders 317, 319, 321, 323, 325, 327, 329, 331, 333, 335, 337, and 339 represent a polar encoder that transforms the input message bits $U_1$ to $U_8$ to a polar codeword represented by $X_1$ to $X_8$, respectively. An SCD generates hard-decision estimates of the bits $U_1$ to $U_8$ by using estimates of the likelihood ratios or log likelihood ratios (LLRs) of the received symbols $Y_1$ to $Y_8$, which are used to successively estimate the likelihood ratios of the intermediate encoded bit values, until eventually estimating the likelihood ratios and hard decision estimates of the input bits. In the case of soft successive cancellation decoding, soft reliability estimates are passed between nodes instead of hard decisions. FIG. 3 shows an order of processing the LRs and making hard decisions by the corresponding decoder, where the order of processing is indicated by the numerals 1-14, where the processing order progresses from a lower valued numeral to a higher valued numeral. The decoder is assumed to use multidimensional decoding and have enough decoding modules where it can perform N/2 decoding operations in parallel, hence it can independently calculate the LLRs of intermediate bits at the input of adder 317 and adder 323, and at the input of adder 327 and adder 331, at the same time, which are then respectively used to independently calculate LLRs of X5 and X6, and X7 and X8, at the same time, respectively.

FIG. 4 is an illustration of a decoding schedule on the corresponding decoding tree for the SCD of FIG. 3.

Referring to FIG. 4, the decoding processing order is represented by a binary tree, where each node represents multiple operations. As described above, an SCD with N/2 decoding modules can deploy multidimensional decoding and calculate LLRs at the inputs of 317 and 323, and 327 and 331, simultaneously. However the decoding tree at the node labeled 1, can also represent sequential calculation of LLRs as by a conventional SCD at the input of 317 and at input of 323, and the input of 327 and the input of 331, if the number of deployed decoding modules is less than N/2. However, the present disclosure is not limited to binary polar codes. The present disclosure may use an m-ary polar code, where a decoding schedule may be represented by an m-ary tree, where m is an integer, where each node in the m-ary tree has m descendants, and where m decoders are executed in a decoding order.

At each node (e.g., a parent node), the LR of one of the children nodes (e.g., the left child node) of the parent node is calculated using the LR of the parent node (e.g., $y_i$), and a hard decision is determined based on the calculated LR of the child node to estimate a value of the LR and propagate the estimated value to the parent node. The LR of the other child node (e.g., the right child) of the parent node is estimated using the LR of the parent node and the hard-decision estimate of the other node (e.g., the left child node), and a hard-decision is determined based on the LR of the other node (e.g., the right child node) to estimate a value of the LR for the other node and propagate the estimated value to the parent node.

In one embodiment of the present disclosure, a decoder is for a code length of 2, where $y_1$ and $y_2$ are LRs of two received codeword bits $Y_1$ and $Y_2$. The LR of one of codeword bits $y_1$ (e.g., the left codeword bit) for a conventional SCD may be calculated as in Equation (1) as follows:

$$L_2^1 = \frac{L(y_1)L(y_2) + 1}{L(y_1) + L(y_2)} \quad (1)$$

A hard decision estimate of the codeword bit $u_1$ (e.g., the left codeword bit) is $\hat{u}_1$ is found by making a hard decision on the value $L_2^1$. The LR of the other codeword bit $y_2$ in a binary decoder (e.g., a right codeword bit i) is calculated as in Equation (2) as follows:

$$L_2^2 = L(y_1)^{1-2\hat{u}_1}L(y_2) \quad (2)$$

which is followed by a hard decision on the value $L_2^2$ to determine $\hat{u}_2$. In another embodiment where the codeword length N is greater than 2, these left LLR calculations are then recursively performed at each node in the decoding tree until reaching the leaf nodes, where hard decisions are made, and the LLRs with their hard decisions are recursively propagated to their parent in the binary tree and used to calculate the LRs of the bits at the right child nodes. Thus, a latency of the multidimensional SCD for a polar code may be described as the number of nodes visited in the binary tree by $$\sum_{i=0}^{(\log_2 N)-1} \frac{N}{2^i} = 2N - 2.$$

For N=8, the order of visited nodes of the multidimensional SCD is illustrated in FIGS. 3 and 4 described above. However, the present disclosure is not limited to using a binary tree. An m-ary tree may be used, where each node has m descendants.

For a code of length $N=2^n$, a root node may be considered to be at level 0, leaf nodes may be considered to be at level n, and a node at level i, for i=0, 1, ..., n, has $2^{n-i}$ leaf nodes as descendants. In one embodiment of the present disclosure, parallelism is performed in tree-structure decoding, e.g., for multidimensional decoding, which has latency 2N−2.

FIG. 5 is an illustration of a decoding schedule for a parallelized SCD for a polar code of length 8, according to an embodiment of the present disclosure.

Referring to FIG. 5, the decoding schedule has a parallelization order of 2 (i.e., parallelization is applied at level 2 in the binary tree of the decoding schedule). A parallelization at level j results in all nodes at level j belonging to the same parent node being decoded in parallel, where m (e.g., 2) SC decoders may be used in parallel, each for a code of length of $m^{n-j}$ (e.g., $2^{n-j}$). A multidimensional SC decoder each executes $m^{n-j}$ operations in parallel at each node at level j, while a conventional SC decoder executes $m^{n-j}$ operations sequentially at each node at level j. In FIG. 6 described below, FIG. 5 is compared to FIG. 4 to determine the difference in decoding schedule between a non-parallelized SCD (i.e., FIG. 4) and a parallelized SCD (i.e., FIG. 5) for a parallelization order of 2 (e.g., m=2).

For example, for a code of length $m^n$, level-n parallelism results in decoding m information bits (code of length 1) at the leaf nodes at a time, thus saving N/m steps. For the binary code with m=2, the decoding latency with multidimensional decoding is reduced to 1.5 N−2.

For the binary code, the level-1 parallelism described above results in decoding 2 subtrees, corresponding to codes of length N/2 in parallel. Thus, latency is cut in half, resulting in a decoding latency of N−1.

In general, the latency of a level-j parallellized multidimensional SC decoder for the binary code may be expressed as in Equation (3) as follows:

$$\sum_{i=0}^{(\log_2 N)-1} \left(\frac{N}{2^i}\right) - \frac{1}{2}\sum_{i=0}^{(\log_2 N)-j} \left(\frac{N}{2^i}\right). \quad (3)$$

Thus, a level-(n−3) parallel decoder has a decoding latency of 1.0625 N−2.

To enable parallelization, at a given level, m (e.g., 2) decoders may execute in parallel. One decoder (e.g., a left decoder) determines one log likelihood ratio (LLR) (e.g., a left LLR), using all the channel information as in a conventional non-parallel decoder. Another decoder (e.g., a right decoder) determines another LLR (e.g., a right LLR) simultaneously without waiting for the decisions from that of the one decoder (e.g., the left decoder). Thus, there is a saving in decoding latency. In doing so, the other (e.g., the right decoder) estimates the decisions from the one decoder (e.g., the left decoder) using the available channel information only. Thus, performance degradation may result.

For a decoding block of an N=2 polar code described above, since $\hat{u}_1$ is not available, $L_2^2$ may be determined as a function f of the input codeword LLRs as in Equation (4) as follows:

$$L_2^2 = f(L(y_1), L(y_2)) \quad (4)$$

In one embodiment of the present disclosure, $L_2^2$ is a function of one of the LLRs (e.g., a left LLRs) in the case where the hard decision $\hat{u}_1$ is zero or one, respectively, as expressed in Equation (5) as follows:

$$L_2^2 = f'(L_2^1 | \hat{u}_1 = 0, L_2^1 | \hat{u}_1 = 1). \quad (5)$$

In one embodiment of the present disclosure, $L_2^2 = L(y_2)$, which is consistent with both Equations (4) and (5) above, such that f simply neglects $L(y_1)$ assuming independency, and f' may be a geometric mean function using Equation (5) and Equation (2) above. Other functions (e.g., an arithmetic mean) may be used. Such a function (e.g., a geometric mean function, an arithmetic mean function, etc.) may be referred to as a parallelization function.

To avoid performance degradation due to incomplete knowledge of a previously decoded bit, a parallelized multidimensional SCD may be integrated with another conventional multidimensional SCD, sharing overlapping functions between the parallelized multidimensional SCD and a conventional multidimensional SCD, and an error checking mechanism. For example, information bits may be encoded with an error detection code such as a cyclic redundancy check (CRC) code. A parallel decoder with a pre-determined parallelization level may be executed on received information bits encoded with an error detection code. After decoding the information bits encoded with an error detection code, the resulting output word may be checked for errors using an error detection mechanism. If no error is detected, the decoding is successful, and decoding latency is reduced. If an error is detected, decoding is unsuccessful, the information bits encoded with an error detection code are decoded with a conventional non-parallelized decoder that may re-use some of the computations of the parallelized decoder, which guarantees that there is no performance loss due to parallelization. However, expected latency increases by the rate of decoding errors of the parallelized decoder, since such errors determine the frequency by which the conventional non-parallelized decoder is executed.

In one embodiment of the present disclosure, computations that are common between a parallelized SCD and a conventional multidimensional SCD need not be repeated, but may be reused by the conventional multidimensional SCD. At worst case, if no computations are shared, the same components may be used to execute the parallelized SCD and the conventional multidimensional SCD simultaneously to save the number of decoding operations that remains to be executed by the conventional decoder in case of an error detection at the output of the parallelized decoder, where the parallelized SCD and the conventional multidimensional SCD may have their own memory registers.

FIG. 6 is an illustration of a comparison of a decoding schedule for a non-parallelized SCD and a parallelized SCD for a polar code of length 8.

Referring to FIG. 6, decoding schedules for a hybrid level-2 parallelized SCD and a conventional multidimensional SCD are illustrated, where the parallelized SCD decoding order is indicated by numerals contained within circles, and the conventional multidimensional non-parallelized SCD decoding order is indicated by numerals not contained within circles, where the decoding order progresses from a lower valued numeral to a higher valued numeral.

The worst case latency is that of the conventional multidimensional non-parallelized SCD, and the best case latency is that of the parallelized SCD. In many communication systems, the latency requirement is made for a transport block which includes multiple code blocks, and using an empirical average code block error rate with a parallelized decoder, a final average latency per code block may be expressed as in Equation (6) as follows:

Latency of hybrid decoder=(Latency of parallelized decoder)*(1−code block error rate of parallelized decoder)+(Latency of conventional decoder)*(code block error rate of parallelized decoder). (6)

In one embodiment of the present disclosure, parallelized successive cancellation decoding may be extended to list decoding via an SCLD. In a conventional SCLD (using a multidimensional method), decoding latency is 3N−2 due to the extra N cycles required for sorting at each of N decoded bits at the leaf nodes to sort 2L path metrics to choose the best L paths. To achieve this latency, it is assumed that L SCDs are executed in parallel. Thus, the parallelization scheme for the SCD may be applied to each of the parallel SCDs, where latency is reduced by the same factor, i.e., for a level-j parallelized decoder, the latency is as in Equation (7) as follows:

$$3N - 2 - \frac{1}{2} \sum_{i=0}^{(\log_2 N)-j} \left(\frac{N}{2^i}\right). \quad (7)$$

However, each parallel decoder results in a list of partial words (e.g., a parallelized list decoding with a level-1 parallelization). However, the present disclosure may be extended to other parallelization levels.

Level-1 parallelization results in decoding two subcodes each of length N/2 in parallel. Using the parallelized SCD described above, a successive cancelation list (SCL) (e.g., a left SCL) and another SCL (e.g., a right SCL) may be executed in parallel. The left SCL is exact, because information regarding the hypotheses of decoded bits from the right side is not required. However, the right SCL that proceeds in parallel ignores hypotheses about the left N/2 decoded bits. Both SCLs simultaneously output a list of L words of length N/2.

In one embodiment of the present disclosure, a list of words of length N are generated from 2 lists of partial words of length N/2, which are generated in parallel. All $L^2$ combinations of both lists, where each word in the right list is concatenated with a word of the left list, are considered to generate a candidate word of length N. The likelihood ratio of each word of the generated list is the product of the corresponding left and right LRs at the output of the corresponding SCL decoders. The L words with the largest product LRs from the generated list are selected. However, the product LR is not exact because the "right" LR is not exact.

In one embodiment of the present disclosure, for each possible combination between the left and right lists, the words of length N are constructed by appending the words of lengths N/2 from the right list to those of the left list to generate a candidate word of length N. The word of length N is re-encoded to generate a candidate transmitted codeword of length N. The likelihood of the received sequence y is calculated given each candidate transmitted codeword in the list. This likelihood may be calculated as a function of a Euclidean distance between the candidate transmitted codeword and the received sequence y. The L words corresponding to the L candidate transmitted codewords with the largest likelihood metrics (or the best one if only one is required) are chosen from the list.

In one embodiment of the present disclosure, instead of generating a list of size $L^2$, as described above, only combinations resulting in the largest 2L LRs may be selected. The best $\sqrt{2L}$ candidates may be selected from each of the left list and the right list before generating the possible combinations so that the resulting list is of size 2L. The best L candidates (according to either method), or the best candidate if a single decoded output is requested may be selected.

In one embodiment of the present disclosure, parallel successive cancelation decoding is provided without an exponential increase in decoding complexity that can result from maximum likelihood decoding of component codes. In addition, a parallelized SCD may be combined with a conventional multidimensional non-parallelized SCD and an error checking mechanism to avoid degradation in performance. Furthermore, parallel successive cancelation list decoding without an exponential increase in computational complexity is provided, where lists of partial words are combined with a list of full words for parallelized successive cancelation list decoding.

FIG. 7 is a block diagram of a parallelized SCD 700, according to an embodiment of the present disclosure.

Referring to FIG. 7, the SCD 700 includes a receiver 701, a processor 703, and m SCDs 705.

The receiver 701 includes an input for receiving a codeword of length $m^j$, where m and j are each an integer, and an output.

The processor 703 includes an input connected to the output of the receiver 701, and an output. The processor 703 determines a decoding node tree structure with int leaf nodes for the received codeword, and receives an integer i indicating a level at which parallelism of order m is applied to the decoding node tree structure, wherein i indicates a number of levels of the decoding node tree structure from 0 to j, and wherein $m^i$ nodes are at level i in the decoding node tree structure with the $m^i$ leaf nodes at level j.

The m SCDs 705 each include an input connected to the output of the processor, and an output. The m SCDs 705 are applied in parallel, wherein with level i parallelism each of the SCDs 705 is applied to one of m child nodes in the decoding node tree structure at level i. All of the m SCDs 705 execute in parallel and each determines soft likelihood metrics for subcodes of length $m^{j+i}$, and wherein each of the m SCDs 705 uses soft likelihood metrics of an associated parent node without using soft or hard decision estimates of the nodes operated upon in parallel by any other of the m SCDs 705, and wherein each of the parallel SCDs 705 also processes in parallel $m^{j-k}$ multiplicities of a node at level k corresponding to bits of the subcode of length $m^{j-k}$, wherein k indicates a number of levels of the decoding node tree structure from i to j.

FIG. 8 is a block diagram of a parallelized SCLD 800, according to an embodiment of the present disclosure.

Referring to FIG. 8, the SCLD 800 includes a receiver 801, a processor 803, and m SCLDs 805.

The receiver 801 includes an input for receiving a codeword of length $m^j$, where m and j are each an integer, and an output.

The processor 803 includes an input connected to the output of the receiver 801, and an output. The processor 803 determines a decoding node tree structure with $m^j$ leaf nodes for the received codeword, and receives an integer i indicating a level at which parallelism of order m is applied to the decoding node tree structure, wherein i indicates a number of levels of the decoding node tree structure from 0 to j, and wherein $m^i$ nodes are at level i in the decoding node tree structure with the $m^j$ leaf nodes at level j.

The m SCLDs 805 each include an input connected to the output of the processor, and an output. The m SCLDs 805 are applied in parallel to determine a list of L partial words of length $m^j/m$. Each of the m SCLDs 805 uses LLRs of an associated parent node without using soft or hard decision estimates the nodes operated upon in parallel by any other of the m SCLDs 805, where L is an integer.

FIG. 9 is a flowchart of a method of a parallelized SCD, according to an embodiment of the present disclosure.

Referring to FIG. 9, a codeword of length $m^j$ is received, by a receiver, at 901, where m and j are each an integer.

At 903, a processor determines a decoding node tree structure with $m^j$ leaf nodes for the received codeword, and receives an integer i indicating a level at which parallelism of order m is applied to the decoding node tree structure, wherein i indicates a number of levels of the decoding node tree structure from 0 to j, and wherein the $m^i$ nodes are at level i in the decoding node tree structure with $m^i$ leaf nodes at level j.

At 905, each child node of each node in the decoding node tree structure at level i is decoded in parallel by one of m SCDs, all of the m SCDs execute in parallel and each determines soft likelihood metrics for subcodes of length $m^{j-i}$, and wherein each of the m SCDs uses soft likelihood metrics of an associated parent node without using soft or hard decision estimates of the nodes operated upon in parallel by any other of the m SCDs, and wherein each of the parallel SCDs also processes in parallel $m^{j-k}$ multiplicities of a node at level k corresponding to bits of the subcode of length $m^{j-k}$, wherein k indicates a number of levels of the decoding node tree structure from i to j.

FIG. 10 is a flowchart of a method of a parallelized SCLD, according to an embodiment of the present disclosure.

Referring to FIG. 10, a codeword of length $m^j$ is received, by a receiver, at 1001, where m and j are each an integer.

At 1003, a processor determines a decoding node tree structure with $m^j$ leaf nodes for the received codeword, and receives an integer i indicating a level at which parallelism of order m is applied to the decoding node tree structure, wherein i indicates a number of levels of the decoding node tree structure from 0 to j, and wherein the $m^i$ nodes are at level i in the decoding node tree structure, with the $m^j$ leaf nodes at level j.

At 1005, the processor determines, by the m SCLDs applied in parallel, a list of L partial words of length $m^j/m$. Each of the m SCLDs uses LLRs of an associated parent node without using soft or hard decision estimates of the nodes operated upon in parallel by any other of the m SCLDs.

Figure 11:
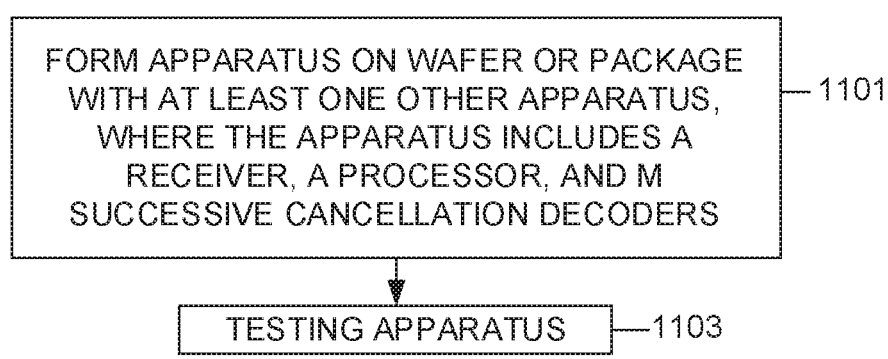
FIG. 11 is a flowchart of a method of manufacturing a parallelized SCD, according to an embodiment of the present disclosure.

FIG. 11 is a flowchart of a method of manufacturing an apparatus, according to an embodiment of the present disclosure.

Referring to FIG. 11, the apparatus is formed on a wafer or a package with at least one other apparatus, where the apparatus includes a receiver, including an input for receiving a codeword of length $m^j$, where m and j are each an integer; a processor configured to determine a decoding node tree structure with $m^j$ leaf nodes for the received codeword, and receive an integer i indicating a level at which parallelism of order m is applied to the decoding node tree structure, wherein i indicates a number of levels of the decoding node tree structure from 0 to j, and wherein the $m^i$ nodes are at level i in the decoding node tree structure with the $m^j$ leaf nodes at level j; and m SCDs applied in parallel, wherein with level i parallelism each of the SCDs is applied to one of m child nodes in the decoding node tree structure at level i, wherein all of the m SCDs execute in parallel and each determines soft likelihood metrics for subcodes of length $m^{j-i}$, and wherein each of the m SCDs uses soft likelihood metrics of an associated parent node without using soft or hard decision estimates of the nodes operated upon in parallel by any other of the m SCDs, and wherein each of the parallel SCDs also processes in parallel $m^{j-k}$ multiplicities of a node at level k corresponding to bits of the subcode of length $m^{j-k}$, wherein k indicates a number of levels of the decoding node tree structure from i to j, at 1101.

At 1103, the functionality of the apparatus is tested. Testing the apparatus includes testing the apparatus using one or more electrical to optical converters, one or more optical splitters that split an optical signal into two or more optical signals, and one or more optical to electrical converters.

Figure 12:
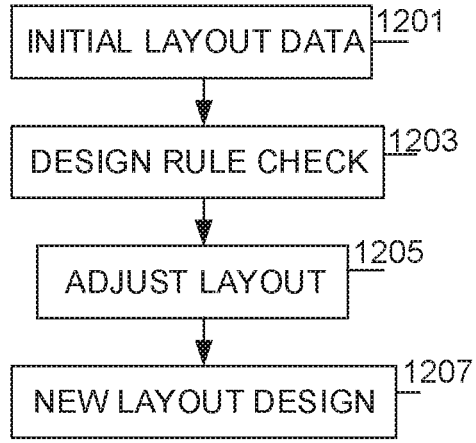
FIG. 12 is a flowchart of constructing an integrated circuit, according to an embodiment of the present disclosure.

FIG. 12 is a flowchart of constructing an integrated circuit, according to an embodiment of the present disclosure.

Referring to FIG. 12, initial layout data is constructed in 1201. For example, a mask layout is generated for a set of features for a layer of the integrated circuit, wherein the mask layout includes standard cell library macros for one or more circuit features that include a receiver, including an input for receiving a codeword of length $m^j$, where m and j are each an integer; a processor configured to determine a decoding node tree structure with $m^j$ leaf nodes for the received codeword, and receive an integer i indicating a level at which parallelism of order m is applied to the decoding node tree structure, wherein i indicates a number of levels of the decoding node tree structure from 0 to j, and wherein $m^i$ nodes are at level i in the decoding node tree structure with the $m^j$ leaf nodes at level j; and m successive cancellation decoders (SCDs) applied in parallel, wherein with level I parallelism each of the SCDs is applied to one of m child nodes in the decoding node tree structure at level i, wherein all of the m SCDs execute in parallel and each determines soft likelihood metrics for subcodes of length $m^{j-i}$, and wherein each of the m SCDs uses soft likelihood metrics of an associated parent node without using soft or hard decision estimates of the nodes operated upon in parallel by any other of the m SCDs, and wherein each of the parallel SCDs also processes in parallel $m^{j-k}$ multiplicities of a node at level k corresponding to bits of the subcode of length $m^{j-k}$, wherein k indicates a number of levels of the decoding node tree structure from i to j, and disregarding relative positions of the macros for compliance to layout design rules during the generation of the mask layout.

At 1203, a design rule check is performed. For example, the method may check the relative positions of the macros for compliance to layout design rules after generating the mask layout.

At 1205, the layout is adjusted. For example, the method, upon detection of noncompliance with the layout design rules by any of the macros, may modify the mask layout by modifying each of the noncompliant macros to comply with the layout design rules.

At 1207, new layout data is generated. For example, the method may generate a mask according to the modified mask layout with the set of features for the layer of the integrated circuit. Then, the integrated circuit layer according to the mask may be manufactured.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a receiver including an input for receiving a codeword of length $m^j$, where m and j are each an integer;
   a processor configured to determine a decoding node tree structure with $m^j$ leaf nodes for the received codeword, and receive an integer i indicating a level at which parallelism of order m is applied to the decoding node tree structure; and
   m successive cancellation decoders (SCDs) configured to decode, in parallel, each child node in the decoding node tree structure at level i.

2. The apparatus of claim 1, wherein i indicates a number of levels of the decoding node tree structure from 0 to j.

3. The apparatus of claim 1, wherein the decoding node tree structure includes $m^i$ nodes at level i and includes $m^j$ leaf nodes at level j.

4. The apparatus of claim 1, wherein each of the m SCDs is further configured, with level i parallelism, to apply to one of m child nodes in the decoding node tree structure at level i.

5. The apparatus of claim 1, wherein all of the m SCDs are further configured to execute in parallel.

6. The apparatus of claim 1, wherein each of the m SCDs is further configured to determine soft likelihood metrics for subcodes of length $m^{j-i}$.

7. The apparatus of claim 1, wherein each of the m SCDs is further configured to use soft likelihood metrics of an associated parent node without using soft or hard decision estimates of the nodes operated upon in parallel by any other of the m SCDs.

8. The apparatus of claim 1, wherein each of the parallel m SCDs processes $m^{j-k}$ multiplicities of a node at level k corresponding to bits of a subcode of length $m^{j-k}$, wherein k indicates a number of levels of the decoding node tree structure from i to j.

9. The apparatus of claim 1, wherein m=2, and one of the m SCDs is configured to determine log likelihood ratios (LLRs) using one of the following equations for determining an LLR:

$$L_2^2 = f(L(y_1), L(y_2));$$

$$L_2^2 = f'(L_2^1 | \hat{u}_1 = 0, L_2^1 = |\hat{u}_1 = 1); \text{ and}$$

$$L_2^2 = L(y_2),$$

wherein $y_1$ and $y_2$ are LLRs of received channel bits in the received codeword, wherein $\hat{u}_1$ and $\hat{u}_2$ are hard decision estimates of the m SCDs, respectively, and wherein f' is selected from one of a geometric mean function or an arithmetic mean function.

10. The apparatus of claim 1, wherein the input is encoded with an error detection code, before encoding with a polar code.

11. The apparatus of claim 10, wherein the error detection code is a cyclic redundancy (CRC) code.

12. The apparatus of claim 11, further comprising an error checker configured to check results of the parallelized SCDs for an error and, if an error is detected, further comprising a non-parallelized SCD configured to decode the received codeword by reusing computations of the m SCDs of the parallelized SCDs and only making additional computations that are necessary to decode the received codeword.

13. A method, comprising:
receiving, by a receiver, a codeword of length $m^j$, where m and j are each an integer;
determining, by a processor, a decoding node tree structure with $m^j$ leaf nodes for the received codeword, and receiving an integer i indicating a level at which parallelism of order m is applied to the decoding node tree structure; and
decoding, by m successive cancellation decoders (SCDs) applied in parallel, each child node in the decoding node tree structure at level i.

14. The method of claim 13, wherein i indicates a number of levels of the decoding node tree structure from 0 to j, and wherein the $m^i$ leaf nodes are at level i in the decoding node tree structure with the $m^i$ leaf nodes at level j.

15. The method of claim 13, wherein, with level i parallelism, each of the SCDs is applied to one of m child nodes in the decoding node tree structure at level i, wherein all of the m SCDs execute in parallel and each determines soft likelihood metrics for subcodes of length $m^{j-i}$.

16. The method of claim 13, wherein each of the m SCDs uses soft likelihood metrics of an associated parent node without using soft or hard decision estimates of the nodes operated upon in parallel by any other of the m SCDs, wherein each of the parallel m SCDs processes $m^{j-k}$ multiplicities of a node at level k corresponding to bits of a subcode of length $m^{j-k}$, and wherein k indicates a number of levels of the decoding node tree structure from i to j.

17. The method of claim 13, wherein m=2, and determining, by one of the m SCDs, log likelihood ratios (LLRs) using one of the following equations for determining an LLR:

$$L_2^2 = f(L(y_1), L(y_2));$$

$$L_2^2 = f'(L_2^1 | \hat{u}_1 = 0, L_2^1 = |\hat{u}_1 = 1); \text{ and}$$

$$L_2^2 = L(y_{2'}),$$

wherein $y_1$ and $y_2$ are LLRs of received channel bits in the received codeword, wherein $\hat{u}_1$ and $\hat{u}_2$ are hard decision estimates of the m SCDs, respectively, and wherein f' is selected from one of a geometric mean function or an arithmetic mean function.

18. The method of claim 13, further comprising encoding the input with an error detection code, before encoding with a polar code.

19. The method of claim 15, wherein encoding the received codeword with an error detection code is comprised of encoding the received codeword with a cyclic redundancy (CRC) code.

20. The method of claim 15, further comprising checking, by an error checker, results of the parallelized SCDs for an error and, if an error is detected, further comprising decoding, by a non-parallelized SCD, the received codeword by reusing computations of the m SCDs of the parallelized SCDs and only making additional computations that are necessary to decode the received codeword.

* * * * *